(12) United States Patent
Postas

(10) Patent No.: US 6,603,414 B1
(45) Date of Patent: Aug. 5, 2003

(54) METHOD FOR DIGITAL COMPRESSION OF CHARACTERS

(75) Inventor: L. John Postas, Campbell, CA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/240,306

(22) Filed: Jan. 29, 1999

(51) Int. Cl.[7] .............................. H03M 7/30; H03M 7/00
(52) U.S. Cl. .............................. 341/87; 341/50; 341/51
(58) Field of Search ........................... 341/106, 51, 90, 341/50, 87; 345/468

(56) References Cited

U.S. PATENT DOCUMENTS

| | | | | |
|---|---|---|---|---|
| 4,545,032 A | * | 10/1985 | Mak ........................... | 341/106 |
| 4,558,302 A | * | 12/1985 | Welch ......................... | 341/51 |
| 4,862,167 A | * | 8/1989 | Copeland, III ............... | 341/106 |
| 5,254,990 A | * | 10/1993 | Yoshida et al. .............. | 341/51 |
| 5,659,737 A | * | 8/1997 | Matsuda ...................... | 341/90 |
| 5,844,508 A | * | 12/1998 | Murashita et al. ............ | 341/51 |
| 6,016,155 A | * | 1/2000 | Hiraike ....................... | 345/468 |
| 6,075,470 A | * | 6/2000 | Little et al. ................. | 341/106 |
| 6,400,286 B1 | * | 6/2002 | Cooper ....................... | 341/106 |

OTHER PUBLICATIONS

IEEE Std 1149.1–1990—Description; IEEE Standard Test Access Port and Boundary–Scan Architecture; http://standards.ieee.org/reading/ieee/std_public; 1990.

IEEE Computer Society; Test Technology Technical Counsel Standards, http://www.computer.org/tab/tttc/standard; Sep. 22, 2001.

* cited by examiner

Primary Examiner—Jean Bruner Jeanglaude
(74) Attorney, Agent, or Firm—Oppenheimer, Wolff & Donnelly, LLP; Leah Sherry

(57) ABSTRACT

Groups of characters, including alpha, numeric, or other symbols, are represented in a binary form by one or more first or second code representations for each character. The first code representation will have a value indicative of a predetermined number of second code representations, wherein each of the second code representations identify a corresponding one of the characters.

60 Claims, 2 Drawing Sheets

METHOD FOR DIGITAL COMPRESSION OF CHARACTERS

COPYRIGHT NOTICE

A portion of the disclosure of this patent document contains material which is subject to copyright protection. The copyright owner has no objection to the xeroxographic reproduction by anyone of the patent document or the patent disclosure in exactly the form it appears in the Patent and Trademark Office patent file or records, but otherwise reserves all copyright rights whatsoever.

BACKGROUND OF THE INVENTION

The invention relates generally to computing systems, and more particularly to a method of compressing characters, including alphanumeric and other character types.

Data compression in computing systems has been used for some time to compress data or characters (e.g., letters, numbers, punctuation marks, or other symbols, including at times control codes) for transmission from one computing system element to another, or for storage (e.g., memory or secondary storage such as disk systems). Data compression operates to achieve faster transmission of the data, and conservation of storage space. Some compression techniques are capable of achieving high compression rates, but at the expense of large program size, performance time, or both. Data compression, therefore, can be a tradeoff between performance, program size, and compression rate.

SUMMARY OF THE INVENTION

The present invention provides a compromise, achieving a good compression rate using a technique that allows the use of a relatively small, efficient program to compress groups of characters.

Broadly, the invention is directed to representing characters by a first code, indicating the number of characters being compressed, and for each character a second code that identifies the character. In one embodiment of the invention, the first code is three bits, and the second code is six bits.

In a preferred embodiment, the invention is used to compress groups of characters, each eight bits in size. A first code identifies the number of characters in the group, and for each character in the group, a second code identifies the particular character. In certain instances, characters that cannot be represented by the second code are represented by a third code, eight bits in size, with the second code pertaining to that character identifying the third code.

The invention finds particular use in the environment of interconnect testing of a computing system employing boundary scan cells. Each cell is specifically identified according to the integrated circuit chip on which it is formed, the particular pin with which it is associated, the generic identification of the integrated circuit, and pin number. Much of this information is redundant and can be easily compressed. However, the pin number, if left in its original designation, will tend to take up a large amount of room. Accordingly, the present invention is used to form a pair of string arrays containing the pin identifications for each boundary cell.

A number of advantages are achieved by the present invention. First, a small, simple program is capable of achieving high compression rates so that boundary cell names, used in testing, can be compressed to a high degree.

A further advantage of the invention is that the storage necessary, for both the compression and decompression program, as well as the compressed data, is significantly reduced.

These advantages, as well as other advantages and aspects of the invention, will become evident to those skilled in the art upon reading of the following description of the invention, which should be taken in conjunction with the accompanying drawings.

DETAILED DESCRIPTION OF THE INVENTION

Figure 1:
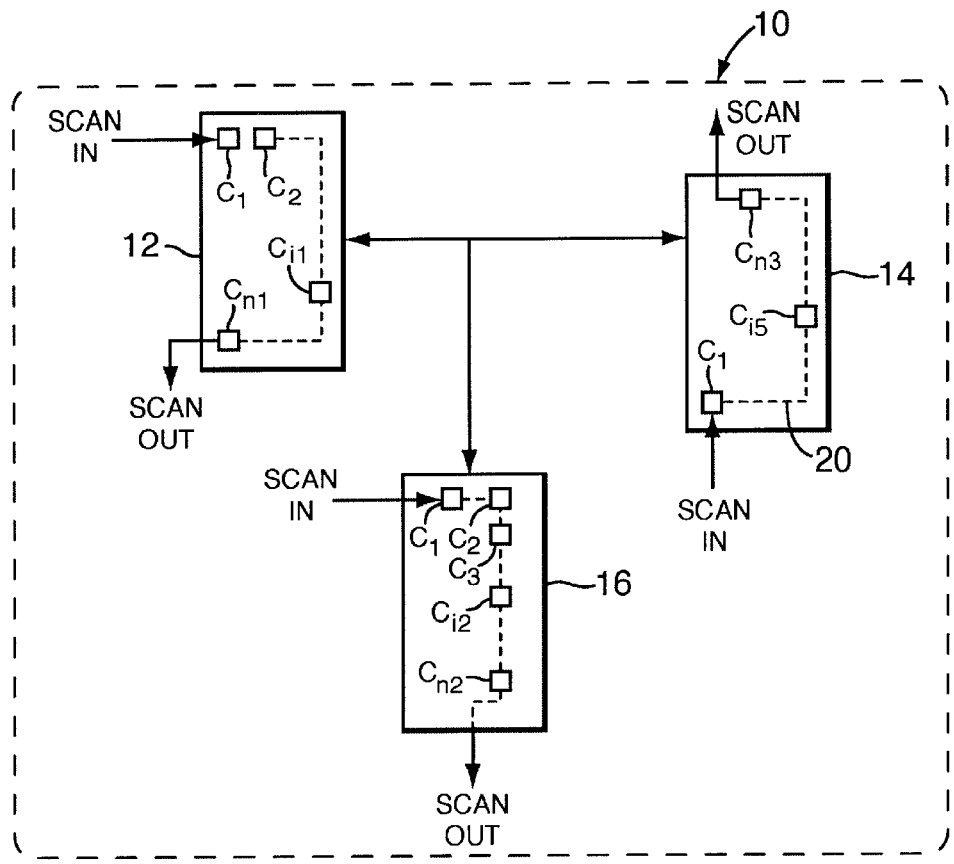
FIG. 1 is an illustrative block diagram of a computing system comprising a number of integrated circuits, each formed with scannable boundary cells, the names of which can be compressed according to the teachings of the present invention.

Turning now to the figures, and specifically FIG. 1, there is illustrated, and designated by the reference numeral 10, is a portion of what may be a larger computing system. As FIG. 1 shows, the computing system portion 10 includes a number of integrated circuit chips 12, 14, and 16 that may interconnect in various ways with one another (and other system elements not shown) for performing computing functions. The integrated circuit chips ("ICs") 12, 14, 16 are constructed to each include a number of scan cells C1, C2, . . . , Cn that may be used for interconnect testing, as well as other types of testing. The scan cell architecture, incorporating the cells C, is described more fully by the IEEE Standard 1149.1, promulgated by the Joint Test Action Group (JTAG), a collaborative organization comprised of major semiconductor users in Europe and North America. According to this standard, the architecture will provide for tests that, among other things, use the cells C to sample the signals then appearing at various inputs and outputs of the system under test (external tests), as well as being able to test certain of the internal circuits of the unit under test (internal tests).

Typically, the scan cells C of one integrated circuit 12–16 will be interconnected to form a single long scan string having a scan input (SCAN IN) and a scan output (SCAN OUT) so that, during testing, test data can be scanned in and applied to inputs and/or outputs as needed, or data that is sampled by the scan cells can be scanned out and examined. Often, the scan string of one device is connected to another device of the system. Thus, for example, the scan string (including the scan cells C1, C2, . . . , Cn) of the integrated circuit 12 are connected to that of the integrated circuit 16 by connecting the SCAN OUT of the integrated circuit 12 to the SCAN IN of the integrated circuit 16. Likewise, the SCAN OUT of the integrated circuit 16 can be connected to the SCAN IN integrated circuit 14.

Test apparatus will, for example, provide stimuli to one of the ICs (e.g., IC 12), using some of the boundary cells and then sample the boundary cells C that are associated with input and output signals that are coupled between the ICs 12, 14, and 16. At the same time, the cells C of the ICs 14 and 16 are also sampled by the boundary cells carried by those ICs. The results may be compared to ensure appropriate interconnectivity; that is, an output signal from the IC 12, communicated on the interconnect 15, should match the input at either of the ICs 14, 16. This is accomplished, of course, by applying the stimuli, and instructing the boundary cells C to sample their respective signals, and then scanning out the sampled information.

Each cell in the larger scan string (e.g., that formed by connecting the individual scan strings of ICs 12–14 as described) is sequentially numbered for example, starting with the first cell C1 receiving the SCAN IN in IC 12 to the last cell Cn3 connected to the SCAN OUT of the IC 14. In addition, associated with each boundary cell C is the identification of the particular pin sampled by the cell in terms of the name or identification of the IC as it appears on a schematic drawing, the schematic pin identification name as well as the generic representation (i.e., the manufacturer's part number) supplied by the manufacturer, again both in the type of IC and pin name. Thus, for example, a cell may be identified as:

16 I U07K9E.A19 TRIC-CCGA624.MCADL34. The "16" is the cell number in the sequence of scan cells that form a scan chain; the "I" identifies the cell as sampling an input signal; the "U07K9E" is the schematic identification of the IC while the "A19" is the schematic pin name of the pin being sampled by the scan cell 16. The "TRIC-CCGA624" is the manufacturer's identification (part number) of the IC while the "MCADL34" is the manufacturers pin name.

Often, this cell identification information is needed by the testing entity to determine the results of the test and to provide information as to where errors, if any, are occurring. Hence, the information must be stored. However, there is a substantial amount of the redundancy. For example, the sequential numbering of the cells in and of itself is redundant. You need only identify the number of cells, and recognize that they should be organized in particular order. Also, the IC identifications (both the schematic identification and the manufacturer identification or part number) are redundant for each IC. However, the pin names, although containing some redundancy, are not subject to the same overall assumptions. In order to conserve storage space, the characters forming the pin names (e.g., "A19" or "MCADL34") are preferably compressed, and the present invention provides a technique for such compression.

Figure 2:
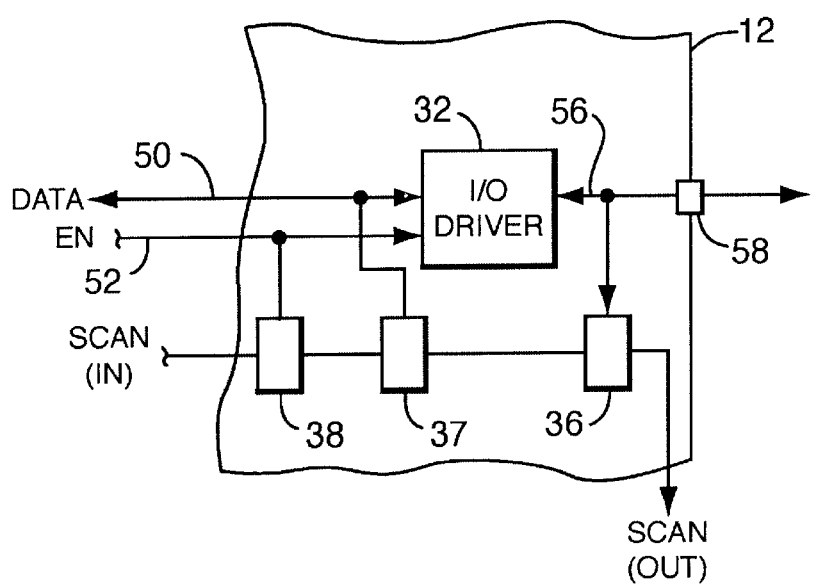
FIG. 2 illustrates the boundary cells associated with a input/output (I/O) driver having associated enable input.

Referring, for the moment, to FIG. 2, there is illustrated boundary cells 36–38 associated with an input-output (I/O) driver device 32 that may be located on the IC 12. The I/O driver 32 would have a data line 50 connecting the I/O driver 32 to internal circuitry (not shown) of the IC 12 and an enable (EN) line 52 from such internal circuitry to select the operating mode (input or output) of the I/O driver. Also, the I/O driver 32 would have an I/O line 56 that connects to a IC pin 58 for carrying input signals from, and output signals to, the pin 58.

Of the three boundary cells 36–38 associated with the I/O driver 32: the boundary cell 36 is connected to sample signals input to the I/O driver 32; the boundary cell 37 will receive, during test, a signal that forces the I/O driver 32 to output a particular state similarly, the boundary cell 38, also during test, will force the enable signal applied to the driver. (Actually, it is more usual that the scan cells 36–38 be a part of the I/O driver or other circuitry, and made switchable to operate in a normal mode, implementing the function(s) for which the IC is designed, and a test mode in which they take on their scan cell operation. They are shown separate here for clarity.) A print-out of the identifications of the scan cells 36–38 may, for example, appear as:

| 36 | I | U15L1A.R04 | SRAM128KX36_5_X-BGA119.MO |
|---|---|---|---|
| 37 | O | U15L1A.R05 | SRAM128KX36_5_X-BGA119.A6 |
| 38 | X | U15L1A. | SRAM128KX36_5_X-BGA119. | where, (for cell 36) the "I" indicates that it samples input signals (the "O" for boundary cell 37 indicates that it is an output); the "U15L1A" is the schematic identification of the IC carrying the cell (line, IC 12); the pin name (pin 58) is R05. The manufacturer chip identification is the "SRAM128KX36_5_X-BGA119," and the manufacturer's pin identification is "MO". Note that the scan cell 38, which forces an enable signal (as indicated by the "X"), has no pin name associated with either the schematic identification or the manufacturer's identification, because it does not connect to an input or an output pin of the IC 12.

As can be seen, there is a substantial amount of redundancy in connection with the identification of each scan cell in terms of the IC schematic and generic representations. Every pin (and there could be hundreds) will have the same identifications for any one IC. However, the pin names will all be different. Thus, according to the present invention, the pin names may be compressed using the following 3-6-8 bit binary codes (expressed in decimal):

3-bit code values:
    0 null string
    1 same as prior
    2 1 or 2 6-bit codes (1 is null-terminated)
    3 3 6-bit bit codes (not null-terminated)
    4 4 6-bit codes (not null-terminated)
    5 5 or more 6-bit codes (null-terminated)
    6 same as prior,+1
    7 same as prior,−1

6-bit code values:
    0 1 8-bit code follows
    1–26 'A' to 'Z'
    27, 28 '$_{13}$',' -'
    29 null ('\0')
    30–39 '0' to '9'
    40–63 '00' to '23' (with implied null)

8-bit code value:
    any other character.

As can be seen (above) the 3-bit code will take on the binary values of "000" to "111" to identify how many 6-bit codes follow—if any. The 3-bit codes "000," "001," "110," and "111" do not have 6-bit codes following them. Rather (except for the 000 code), they rely upon the immediately preceding decompressed character group. For example, suppose a first group of characters to be compressed were "A0" and this was to be followed by a second group "A1". The first group would compress one 3-bit code ("010") to indicate that two 6-bit codes follow, one for each of the characters "A0". In order to encode (compress) "A1" only the 3-bit code "110" need be used. This, in effect, adds 1 to the trailing digits of the prior compressed character group. The 6-bit code "111" operates in the same manner, except that the trailing digits of the prior decompressed character group are decremented by 1. Thus, if the first character group was "A1" to be followed by "A0", the compression of the character group "A1", in this instance, need only be "111". The 6-bit code "001" indicates that the prior group of characters should be repeated verbatim.

The 3-bit code "110" is taken to mean "add 1—with carry if necessary, and the 3-bit code "111" is "decrement 1—with borrow if necessary." For example, if a prior character group is "PIN100" followed by "PIN099", the compressed form of the latter would be 111 (subtract 1 with borrow). Conversely, if the character group PIN099 is followed by PIN100, the compression of PIN100 as "110" means that decompression involves adding 1 to the prior character group (PIN099) with a carry, producing PIN100.

Using these codes, pin names can be compressed to form a pin name string for the boundary cells C forming the entire scan string. Preferably, there is formed a compressed string for the schematic pin names, and a second compressed string for the manufacturer's pin names.

Figure 3:
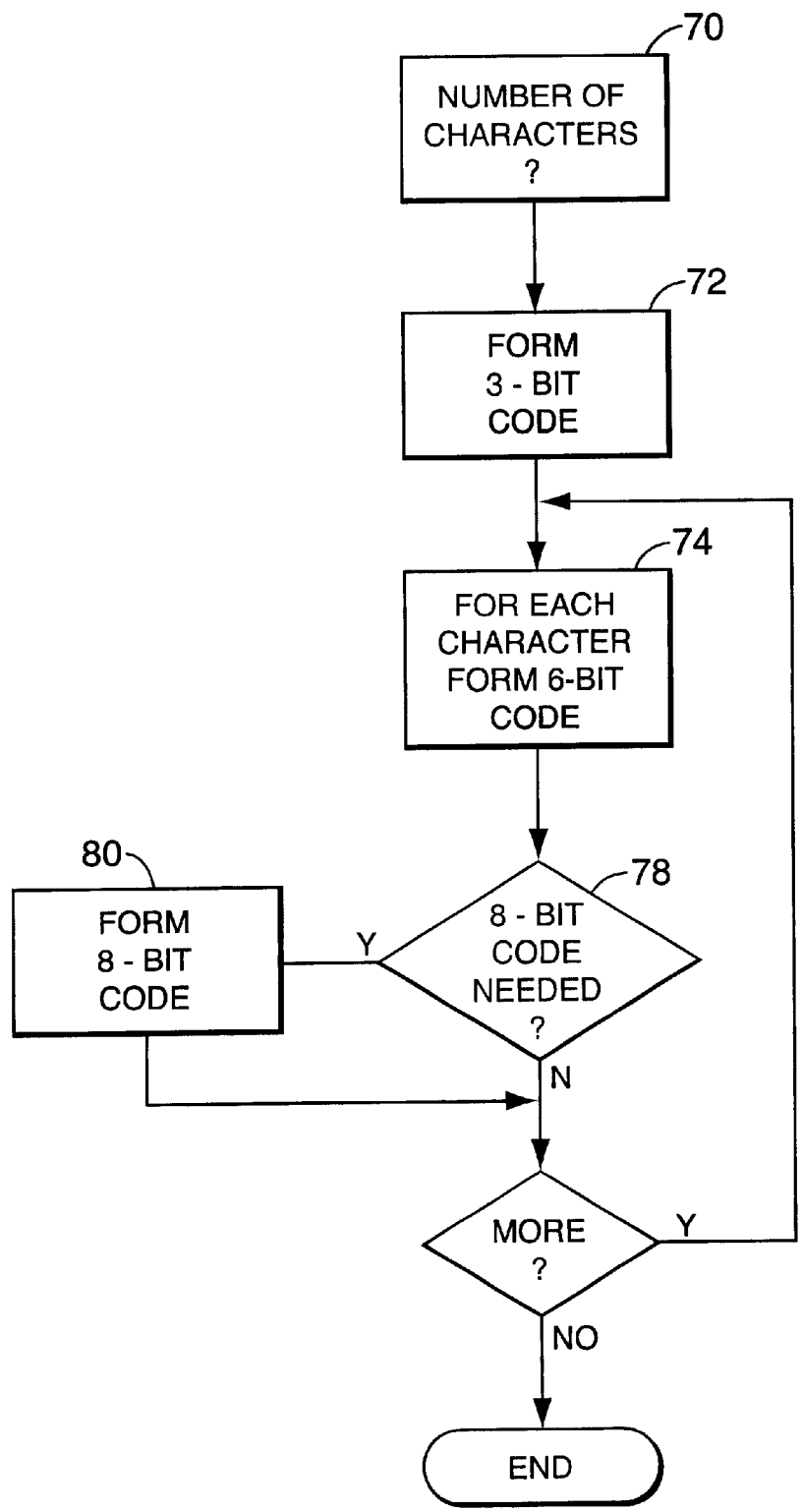
FIG. 3 is a flow diagram, illustrating the major steps taken in compressing portions of the cell names, namely the pin names, according to the present invention.

The steps taken to compress the pin names, according to the present invention, are illustrated in FIG. 3. The procedure begins, at step 70 by determining how many characters are in the pin name being compressed. Once that is determined, the 3-bit code is formed in step 72. Then, for each character in the pin name there is a 6-bit code formed at step 74. If the character is determined, in step 78, to need an 8-bit code (e.g., it is a special character), the 8-bit code is formed. Otherwise, a 6-bit code represents the character. At step 82, it is determined if there are any more characters in the pin name and, if so, another 6-bit, (and appended 8-bit) code is formed until the pin name is compressed. If no more characters exist, the procedure exits.

To further illustrate the operation of the invention by a simplistic example, assume that the pin name, as it appears on a schematic, for the pin 58 is DATA00. Assume further that another I/O driver circuit (not shown) carried by the IC 12 has the pin name DATA01, and has scan cells 39, 40, and 41 (the latter being for an enable signal) are also carried (but not shown) by the IC 12. Table 1 shows the use of the present invention to encode the pin names DATA00 and DATA01. The initial (uncompressed or unencoded) space for the cell names is 24 characters; the compressed space is 6 bytes (48 data bits). Thus, the compression for this example is about 72 percent.

TABLE 1

| Cell No. | Pin Name | Encoding Stream |
| --- | --- | --- |
| 36 | DATA00 | 101 000100 000001 010100 000001 101000 |
| 37 | | 000 |
| 37 | DATA00 | 001 |
| 39 | DATA01 | 110 |
| 40 | DATA01 | 001 |
| 41 | | 000 |

Note that the boundary cells 38 and 41, as shown in Table 1, have no pin names associated with them. As explained above, these are for enable signals that are not applied to, or received from, the pin (e.g., pin 58, FIG. 2). Thus, the "000" (null) code is used to indicate this fact.

The resultant schematic pin name compressions are then preferably placed in a string in sequential order according to the cell number. Thus, for example, the pin name compressions for the boundary cells 36–41 of Table 1 would form a partial string: 101 000100 000001 010100 000001 101000 000 001 110 001 000
and be included in a larger string containing the compressed pin names of all the boundary cells of the scan string formed from the cells of the ICs 12, 14, 16. As indicated, the compressed pin names would be in a sequence that matches the cell number sequence. A similar, but separate compressed pin name string is formed for the manufacturer's pin names, also ordered in the same sequential manner as the compressed schematic pin names.

The other portions of the full cell identification, e.g., the IC identification, the manufacturer's identification, etc., are compressed in a fashion not relevant to the understanding of the present invention. Suffice it to say that the compression used for these identifications will rely heavily on the redundancies present therein.

Attached as Appendixes A and B are program listings for the compression of character groups (in perl, at pages 12–15 of Appendix A) and the decompression of character groups (in C, at pages 16–18), respectively, to further provide examples of how to implement the above described functionality of the invention.

While a full and complete disclosure of the invention has been provided herein above, it will be obvious to those skilled in the art that various modifications and changes may be made.

What is claimed is:

1. A method of compressing a plurality of characters, including alpha, numeric, or other symbols or control codes, in digital form, the plurality of characters including at least a first character group followed by a second character group, the method including the steps of:

providing a first data component identifying the plurality of characters; and providing, for each of the plurality of characters, one or more of first and second as codes to represent such plurality of characters wherein,
  (i) the first code has a value indicative of a predetermined number of second codes, and
  (ii) each of the predetermined number of second codes associated with the first code identifying a corresponding one of the plurality of characters.

2. The method of claim 1, wherein the first code is a three-bit code that indicates, for each selected one of the plurality of second codes, one of
  1 or 2 second codes follow,
  3 or 4 second codes follow,
  5 or more second codes follow.

3. The method of claim 2, wherein the three bits further indicates no second codes follow.

4. The method of claim 2, wherein the second code is a six-bit code that indicates, for each selected one of the plurality of characters, one of
  a third code follows,
  a character of the alphabet,
  a _ (underscore) or a - (hyphen),
  a null,
  a single digit decimal numeric,
  a double digit numeric.

5. The method of claim 4, wherein the third code represents an alphanumeric character not capable of representation by the second code.

6. The method of claim 1, including the step of forming a string of the first and second codes.

7. A method of digitally representing groups of one or more characters in a compressed string, the characters including alpha, numeric, and other symbols, the method including the steps of:

for each group of characters,
  (a) forming a first code indicative of a number of characters in such group; and
  (b) for each one of the characters in such group, forming a second code representative of such character.

8. The method of claim 7, wherein the first and second codes are three and six bits respectively.

9. The method of claim 7, wherein the step (b) includes forming for predetermined characters a second code indicative of an third code for such predetermined characters, and forming the third code representative of such character.

10. The method of claim 7, wherein the first code is three bits.

11. The method of claim 10, wherein the second code is six bits.

12. The method of claim 11, wherein the third code is eight bits.

13. A computer-readable medium embodying a computer program having instructions configured to cause a computer system to perform steps for compressing a plurality of characters, including alpha, numeric, or other symbols or control codes, in digital form, the plurality of characters including at least a first character group followed by a second character group, the steps comprising:
   providing a first data component identifying the plurality of characters; and
   providing, for each of the plurality of characters, one or more of first and second codes to represent such plurality of characters wherein,
      (i) the first code has a value indicative of a predetermined number of second codes, and
      (ii) each of the predetermined number of second codes associated with the first code identifying a corresponding one of the plurality of characters.

14. The computer-readable medium of claim 13, wherein the first code is a three-bit code that indicates, for each selected one of the plurality of second codes, one of
   1 or 2 second codes follow,
   3 or 4 second codes follow,
   5 or more second codes follow.

15. The computer-readable medium of claim 14, wherein the three bits further indicates no second codes follow.

16. The computer-readable medium of claim 14, wherein the second code is a six-bit code that indicates, for each selected one of the plurality of characters, one of
   a third code follows,
   a character of the alphabet,
   a _ (underscore) or a - (hyphen),
   a null,
   a single digit decimal numeric,
   a double digit numeric.

17. The computer-readable medium of claim 16, wherein a third code represents an alphanumeric character not capable of representation by the second code.

18. The computer-readable medium of claim 13, including the step of forming a string of the first and second codes.

19. The computer-readable medium of claim 13, wherein the first code is a three-bit code that indicates that the second character group is the same as the first character group.

20. The computer-readable medium of claim 13, wherein the first code is a three-bit code that indicates that the second character group is the same as the first character group plus one (1).

21. The method of claim 1, wherein the first code is a three-bit code that indicates that the second character group is the same as the first character group minus one (1).

22. A computer-readable medium embodying a computer program having instructions configured to cause a computer system to perform steps for digitally representing groups of one or more characters in a compressed string, the characters including alpha, numeric, and other symbols, the steps comprising:
   for each group of characters,
      (a) forming a first code indicative of a number of characters in such group; and
      (b) for each one of the characters in such group, forming a second code representative of such character.

23. The computer-readable medium of claim 22, wherein the first and second codes are three and six bits respectively.

24. The computer-readable medium of claim 22, wherein the step (b) includes forming, for predetermined characters, a second code indicative of a third code for such predetermined characters, and forming the third code representative of such character.

25. The computer-readable medium of claim 22, wherein the first code is three bits.

26. The computer-readable medium of claim 25, wherein the second code is six bits.

27. The computer-readable medium of claim 26, wherein a third code is eight bits.

28. A computer system for compressing a plurality of characters, including alpha, numeric, or other symbols or control codes, in digital form, the plurality of characters including at least a first character group followed by a second character group, the computer system comprising:
   a memory for storing instructions;
   a processor coupled to the memory configured to
   provide a first data component identifying the plurality of characters; and
   provide, for each of the plurality of characters, one or more of first and second codes to represent such plurality of characters wherein,
      (i) the first code has a value indicative of a predetermined number of second codes, and
      (ii) each of the predetermined number of second codes associated with the first code identifying a corresponding one of the plurality of characters.

29. The computer system of claim 28, wherein the first code is a three-bit code that indicates, for each selected one of the plurality of second codes, one of
   1 or 2 second codes follow,
   3 or 4 second codes follow,
   5 or more second codes follow.

30. The computer system of claim 29, wherein the three bits further indicates no second codes follow.

31. The computer system of claim 29, wherein the second code is a six-bit code that indicates, for each selected one of the plurality of characters, one of
   a third code follows,
   a character of the alphabet,
   a _ (underscore) or a - (hyphen),
   a null,
   a single digit decimal numeric,
   a double digit numeric.

32. The computer system of claim 31, wherein a third code represents an alphanumeric character not capable of representation by the second code.

33. The computer system of claim 28, including the step of forming a string of the first and second codes.

34. The computer system of claim 28, wherein the first code is a three-bit code that indicates that the second character group is the same as the first character group.

35. The computer system of claim 28, wherein the first code is a three-bit code that indicates that the second character group is the same as the first character group plus one (1).

36. The computer system of claim 28, wherein the first code is a three-bit code that indicates that the second character group is the same as the first character group minus one (1).

37. A computer system for digitally representing groups of one or more characters in a compressed string, the characters including alpha, numeric, and other symbols, the computer system comprising:

for each group of characters,
- (a) forming a first code indicative of a number of characters in such group; and
- (b) for each one of the characters in such group, forming a second code representative of such character.

38. The computer system of claim 37, wherein the first and second codes are three and six bits respectively.

39. The computer system,of claim 37, wherein forming a second code includes forming, for predetermined characters, a second code indicative of a third code for such predetermined characters, and forming the third code representative of such character.

40. The computer system of claim 37, wherein the first code is three bits.

41. The computer system of claim 40, wherein the second code is six bits.

42. The computer system of claim 41, wherein a third code is eight bits.

43. A computer system for compressing a plurality of characters, including alpha, numeric, or other symbols or control codes, in digital form, the plurality of characters including at least a first character group followed by a second character group, the computer system comprising:

means for providing a first data component identifying the plurality of characters; and means for providing, for each of the plurality of characters, one or more of first and second codes to represent such plurality of characters wherein,
- (i) the first code has a value indicative of a predetermined number of second codes, and
- (ii) each of the predetermined number of second codes associated with the first code identifying a corresponding one of the plurality of characters.

44. The computer system of claim 43, wherein the first code is a three-bit code that indicates, for each selected one of the plurality of second codes, one of 1 or 2 second codes follow,;

3 or 4 second codes follow, 5 or more second codes follow.

45. The computer system of claim 44, wherein the three bits further indicates no second codes follow.

46. The computer system of claim 44, wherein the second code is a six-bit code that indicates, for each selected one of the plurality of characters, one of a third code follows, a character of the alphabet, a _ (underscore) or a - (hyphen), a null, a single digit decimal numeric, a double digit numeric.

47. The computer system of claim 46, wherein a third code represents an alphanumeric character not capable of representation by the second code.

48. The computer system of claim 43, including the step of forming a string of the first and second codes.

49. The computer system of claim 43, wherein the first code is a three-bit code that indicates that the second character group is the same as the first character group.

50. The computer system of claim 43, wherein the first code is a three-bit code that indicates that the second character group is the same as the first character group plus one (1).

51. The computer system of claim 43, wherein the first code is a three-bit code that indicates that the second character group is the same as the first character group minus one (1).

52. A computer system for digitally representing groups of one or more characters in a compressed string, the characters including alpha, numeric, and other symbols, the computer system comprising:

for each group of characters,
- (a) means for forming a first code indicative of a number of characters in such group; and
- (b) for each one of the characters in such group, means for forming a second code representative of such character.

53. The computer system of claim 52, wherein the first and second codes are three and six bits respectively.

54. The computer system of claim 52, wherein the means for forming a second code includes means for forming, for predetermined characters, a second code indicative of a third code for such predetermined characters, and means for forming the third code representative of such character.

55. The computer system,of claim 52, wherein the first code is three bits.

56. The computer system of claim 55, wherein the second code is six bits.

57. The computer system of claim 56, wherein a third code is eight bits.

58. The method of claim 1, wherein the first code is a three-bit code that indicates that the second character group is the same as the first character group.

59. The method of claim 1, wherein the first code is a three-bit code that indicates that the second character group is the same as the first character group plus one (1).

60. The method of claim 1, wherein the first code is a three-bit code that indicates that the second character group is the same as the first character group minus one (1).

* * * * *